US 11,419,218 B2

(12) United States Patent
Noh

(10) Patent No.: US 11,419,218 B2
(45) Date of Patent: Aug. 16, 2022

(54) MULTILAYERED CERAMIC SUBSTRATE AND METHOD FOR MANUFACTURING SAME

(71) Applicant: DIT Co., Ltd., Siheung-si (KR)

(72) Inventor: Tae Hyung Noh, Siheung-si (KR)

(73) Assignee: DIT CO., LTD., Siheung-si (KR)

( * ) Notice: Subject to any disclaimer, the term of this patent is extended or adjusted under 35 U.S.C. 154(b) by 503 days.

(21) Appl. No.: 16/615,818

(22) PCT Filed: Jun. 8, 2018

(86) PCT No.: PCT/KR2018/006066
§ 371 (c)(1),
(2) Date: Nov. 22, 2019

(87) PCT Pub. No.: WO2019/004609
PCT Pub. Date: Jan. 3, 2019

(65) Prior Publication Data
US 2020/0084894 A1    Mar. 12, 2020

(30) Foreign Application Priority Data

Jun. 29, 2017   (KR) .......................... 10-2017-0082316

(51) Int. Cl.
*H05K 1/00*    (2006.01)
*H05K 1/03*    (2006.01)
(Continued)

(52) U.S. Cl.
CPC ......... *H05K 3/1291* (2013.01); *H05K 3/3494* (2013.01); *H05K 3/4061* (2013.01); *H05K 3/4605* (2013.01); *H05K 2203/1126* (2013.01)

(58) Field of Classification Search
CPC .. H05K 1/00; H05K 1/03; H05K 1/09; H05K 1/11; H05K 1/16; H05K 1/113;
(Continued)

(56) References Cited

U.S. PATENT DOCUMENTS 5,525,402 A * 6/1996 Nakamura ........... H01L 21/4853
428/209
6,413,620 B1 * 7/2002 Kimura .................... H05K 3/20
428/209
(Continued)

FOREIGN PATENT DOCUMENTS

CN       1868242 A     11/2006
CN     101414597 A      4/2009
(Continued)

*Primary Examiner* — Xiaoliang Chen
(74) *Attorney, Agent, or Firm* — Patent Office of Dr. Chung Park

(57) ABSTRACT

The present disclosure relates to a multilayer ceramic substrate preparation method. The multilayer ceramic substrate preparation method according to the present disclosure includes firing a plurality of ceramic green sheets, to create a plurality of ceramic thin films; forming a via hall in each of the plurality of ceramic thin films; filling the via hall of the plurality of ceramic thin films with conductive paste, and heat treating the via hall filled with the conductive paste, to form a via electrode; printing a pattern on a cross section of each of the plurality of ceramic thin films, and heat treating the printed pattern, to form an inner electrode; applying a bonding agent on the cross section of each of the ceramic thin films excluding an uppermost ceramic thin film of the plurality of ceramic thin films; aligning and laminating each of the plurality of ceramic thin films such that each of the plurality of ceramic thin films is electrically connected through the via electrode and the inner electrode; and firing or heat treating the laminated plurality of ceramic thin films.

5 Claims, 11 Drawing Sheets

(51) Int. Cl.
| | |
|---|---|
| *H05K 1/09* | (2006.01) |
| *H05K 1/11* | (2006.01) |
| *H05K 1/16* | (2006.01) |
| *H05K 3/10* | (2006.01) |
| *H05K 3/20* | (2006.01) |
| *H05K 3/40* | (2006.01) |
| *H05K 3/46* | (2006.01) |
| *H01L 21/48* | (2006.01) |
| *H01L 23/13* | (2006.01) |
| *H01L 23/15* | (2006.01) |
| *H01L 23/24* | (2006.01) |
| *H01L 23/34* | (2006.01) |
| *H01L 23/48* | (2006.01) |
| *H01L 23/498* | (2006.01) |
| *C03B 29/00* | (2006.01) |
| *H05K 3/12* | (2006.01) |
| *H05K 3/34* | (2006.01) |

(58) Field of Classification Search
CPC .......... H05K 1/141; H05K 1/186; H05K 3/01; H05K 3/20; H05K 3/40; H05K 3/46; H05K 3/205; H05K 3/1291; H05K 3/4629; H01L 21/48; H01L 21/4853; H01L 21/6831; H01L 23/13; H01L 23/15; H01L 23/24; H01L 23/34; H01L 23/48; H01L 23/498; C03B 29/00
USPC ... 156/89.11, 89.12, 89.17, 89.18, 73.1, 155, 156/345.52; 174/255, 257, 258; 428/131, 209, 210
See application file for complete search history.

(56) References Cited

U.S. PATENT DOCUMENTS

| | | | |
|---|---|---|---|
| 6,488,795 B1* | 12/2002 | Sakai | H05K 3/4611 156/89.18 |
| 2005/0176255 A1 | 8/2005 | Casey et al. | |
| 2005/0263238 A1* | 12/2005 | Takase | C04B 35/638 156/155 |
| 2007/0108586 A1* | 5/2007 | Uematsu | H05K 3/4629 257/690 |
| 2007/0221399 A1* | 9/2007 | Nishizawa | H01L 24/97 174/250 |
| 2007/0278670 A1* | 12/2007 | Kimura | H01L 23/24 257/E23.125 |
| 2010/0155118 A1* | 6/2010 | Okada | H05K 3/4611 174/257 |
| 2011/0036622 A1* | 2/2011 | Chikagawa | B32B 18/00 174/257 |
| 2011/0092072 A1* | 4/2011 | Singh | C23C 14/50 156/345.52 |
| 2013/0220989 A1* | 8/2013 | Pease | H01L 21/67103 219/458.1 |
| 2018/0277395 A1* | 9/2018 | Masukawa | B32B 38/10 |
| 2019/0047915 A1* | 2/2019 | Itoh | H05K 3/46 |

FOREIGN PATENT DOCUMENTS

| | | |
|---|---|---|
| JP | 6-97958 A | 4/1994 |
| JP | 2002-344138 A | 11/2002 |
| JP | 2008-034828 A | 2/2008 |
| JP | 2009-158576 A | 7/2009 |
| JP | 4705320 B2 | 6/2011 |
| KR | 10-2006-0061380 A | 6/2006 |
| KR | 10-0765945 B1 | 10/2007 |
| KR | 10-2009-0121527 A | 11/2009 |
| KR | 10-0978664 B1 | 8/2010 |
| KR | 10-2093157 B1 | 3/2020 |

* cited by examiner

[Fig. 1]
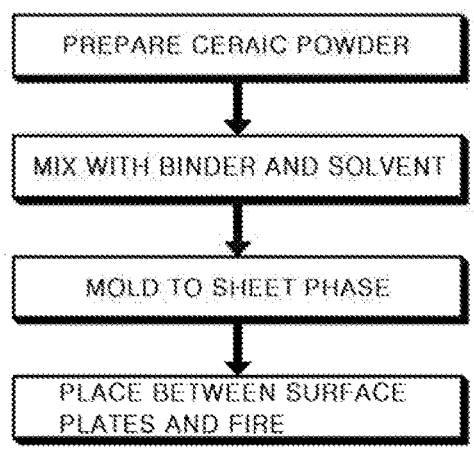
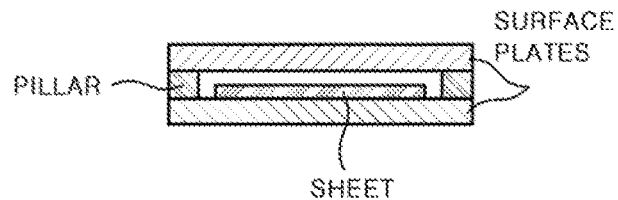

[Fig. 2]
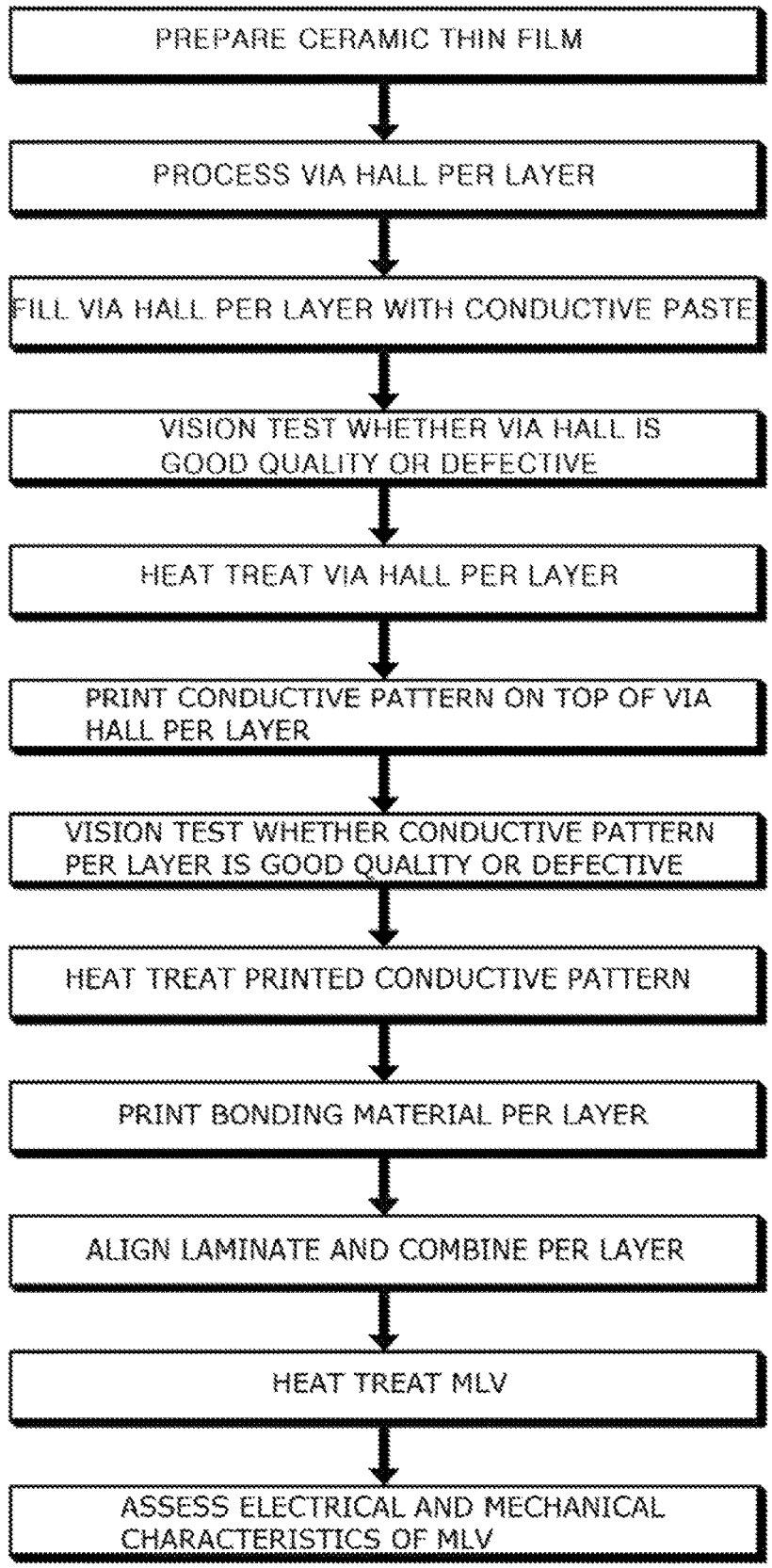

[Fig. 3]
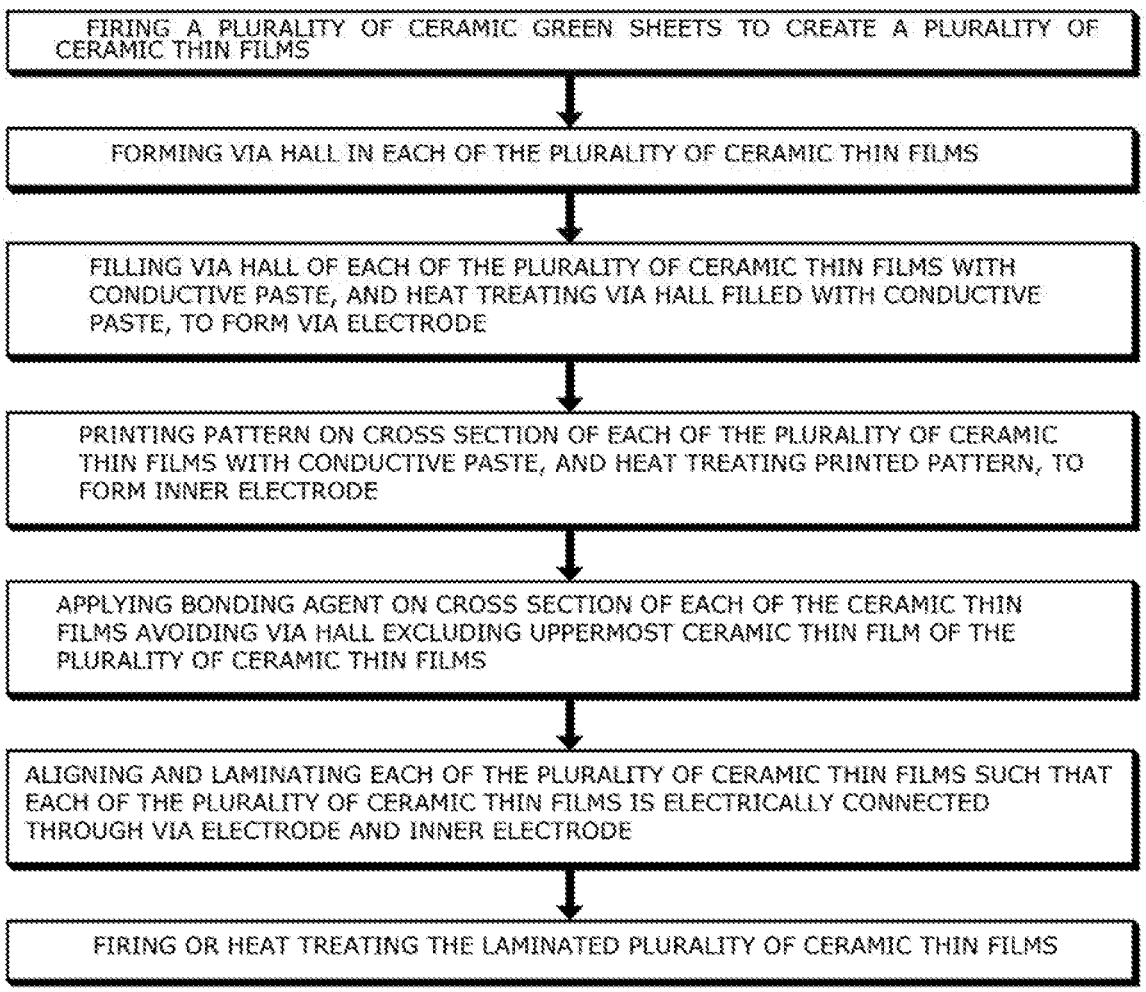
[Fig. 4]
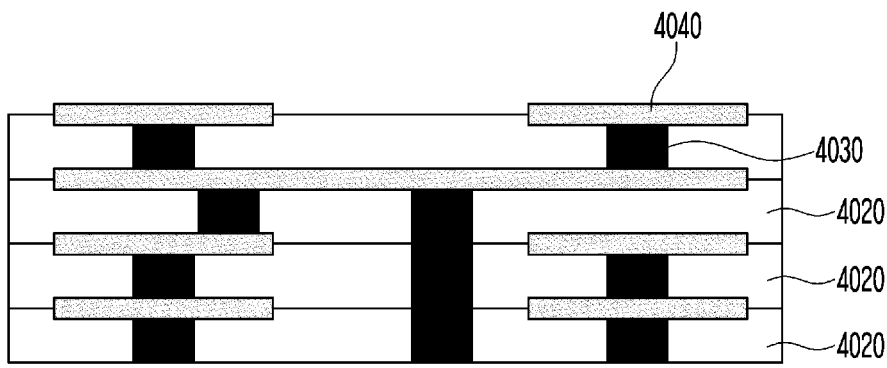

[Fig. 5]
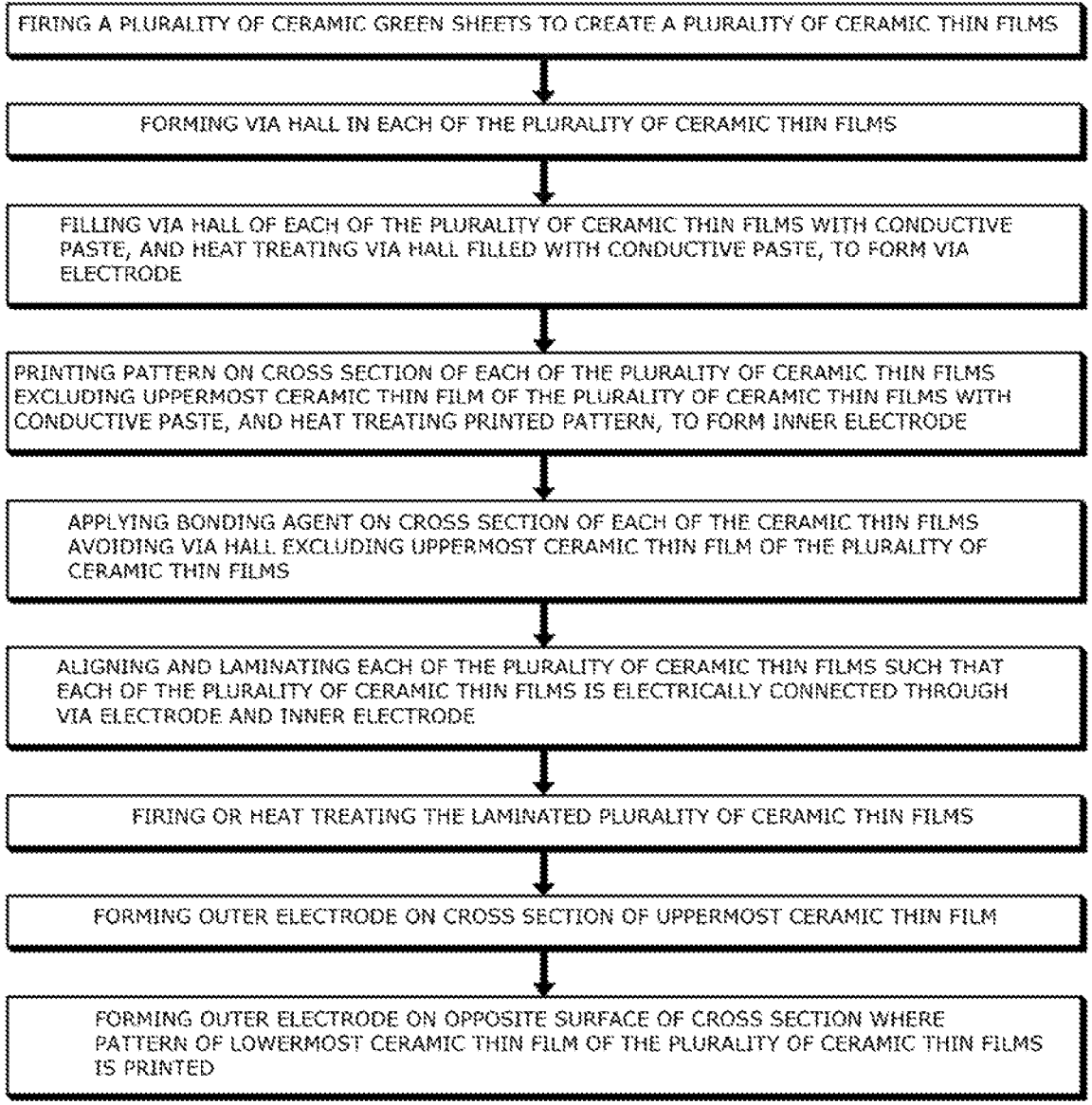

[Fig. 6]
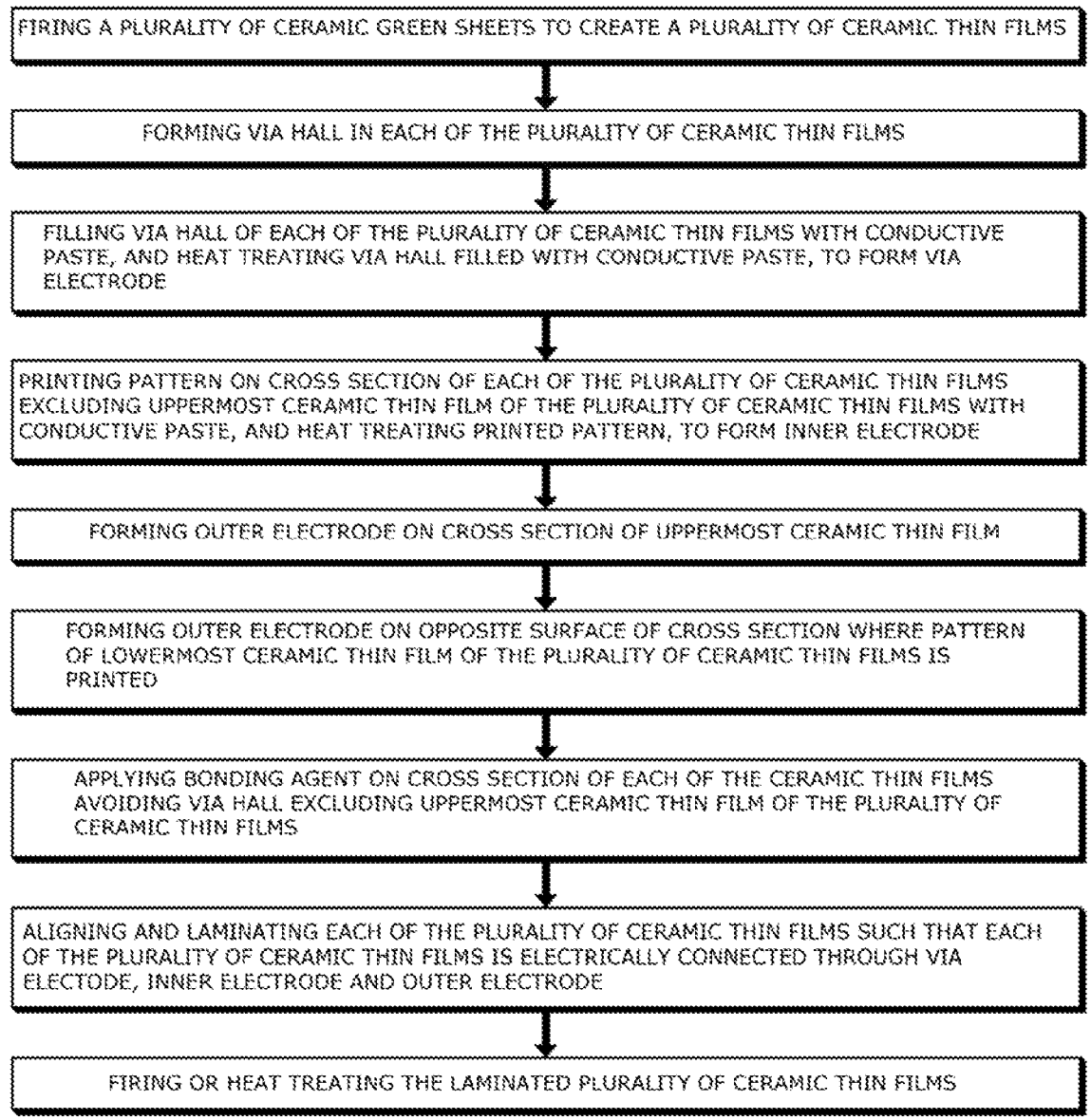

[Fig. 7]
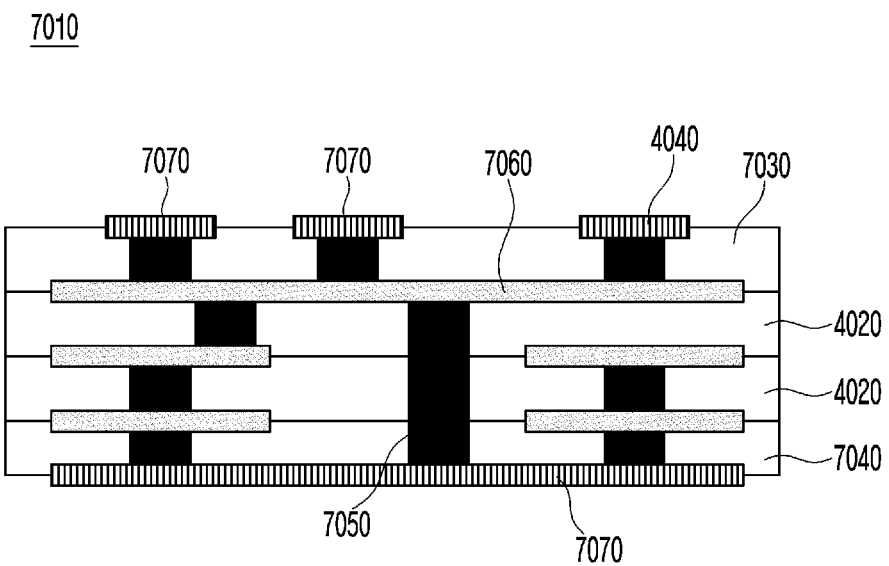

[Fig. 8]
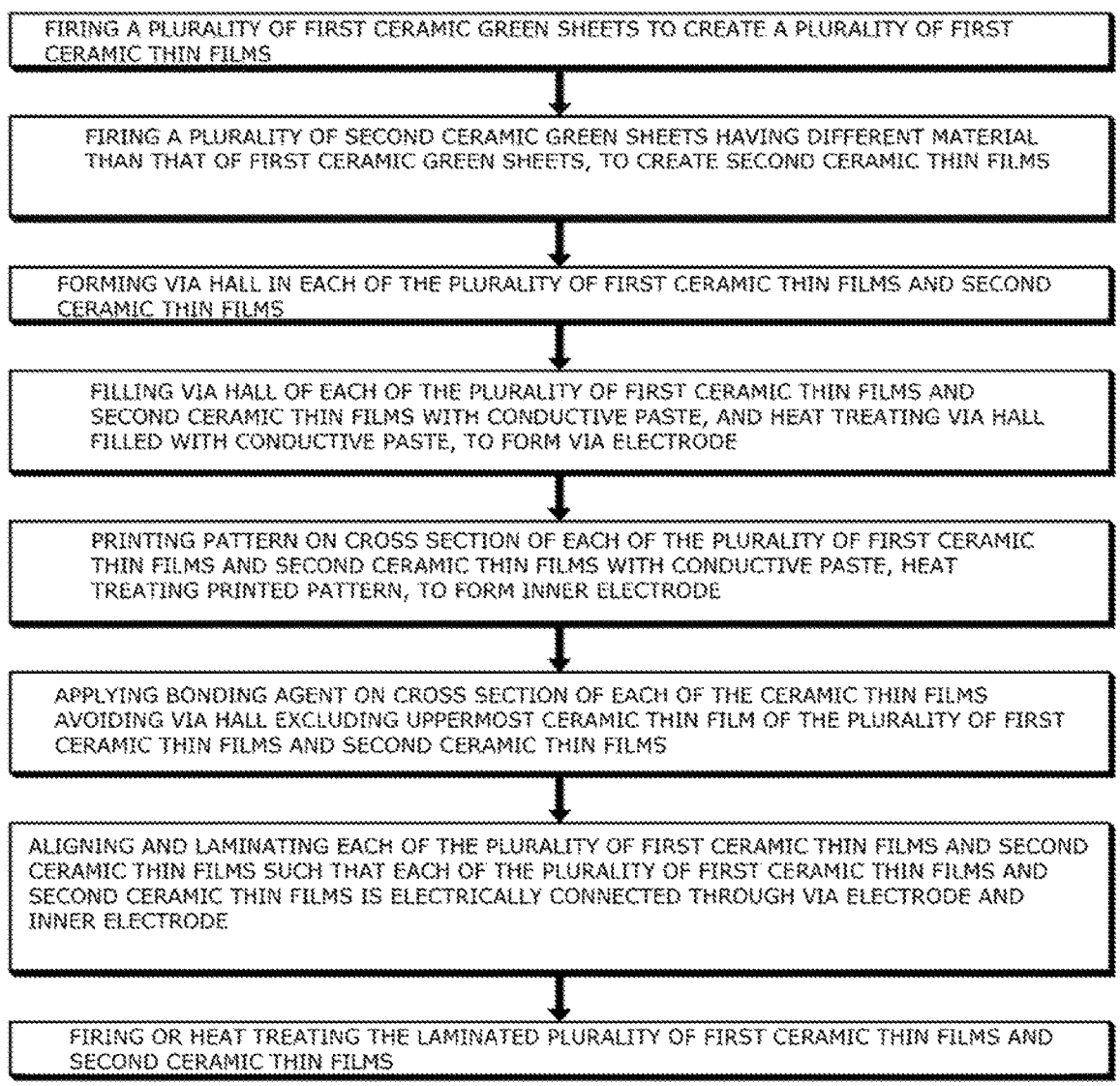

[Fig. 9]
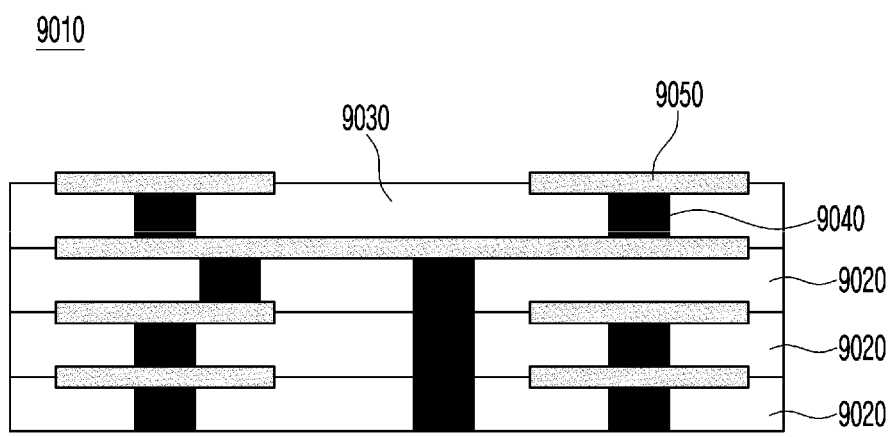

[Fig. 10]
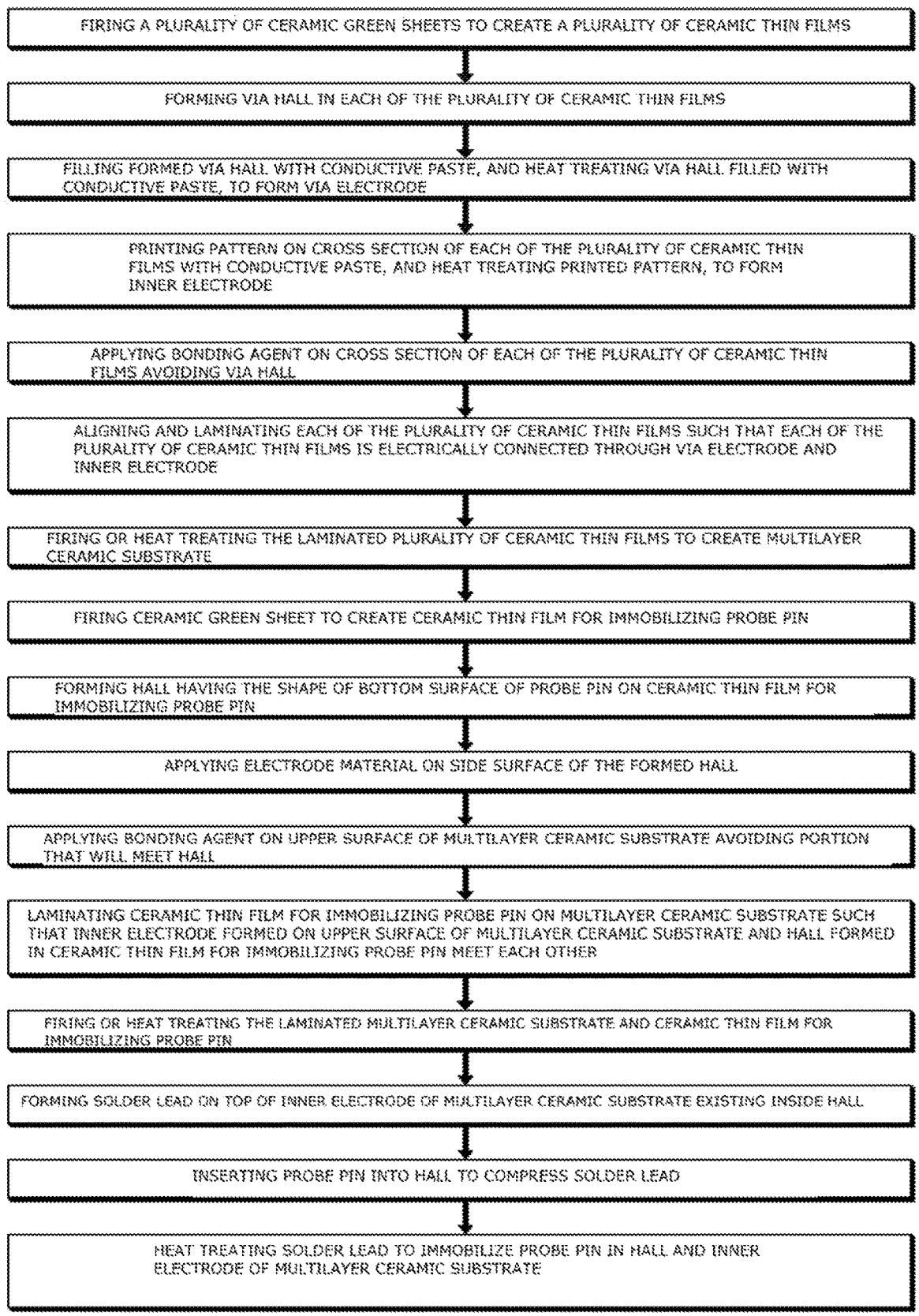

[Fig.11]
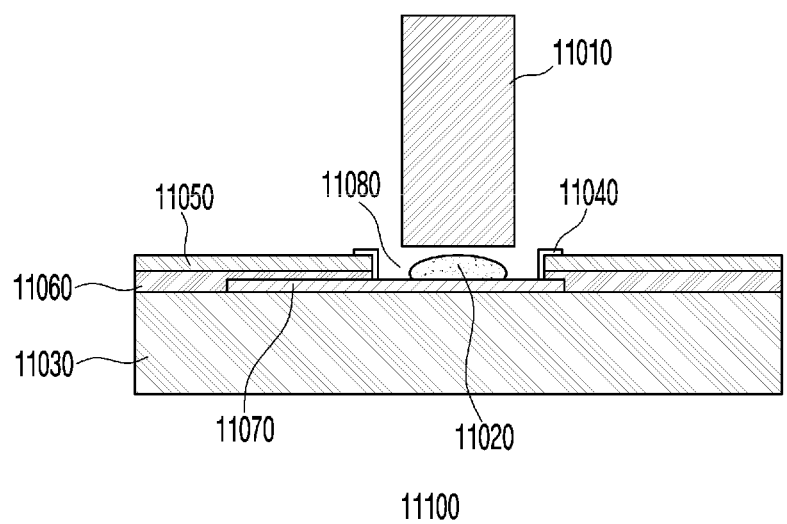
11100
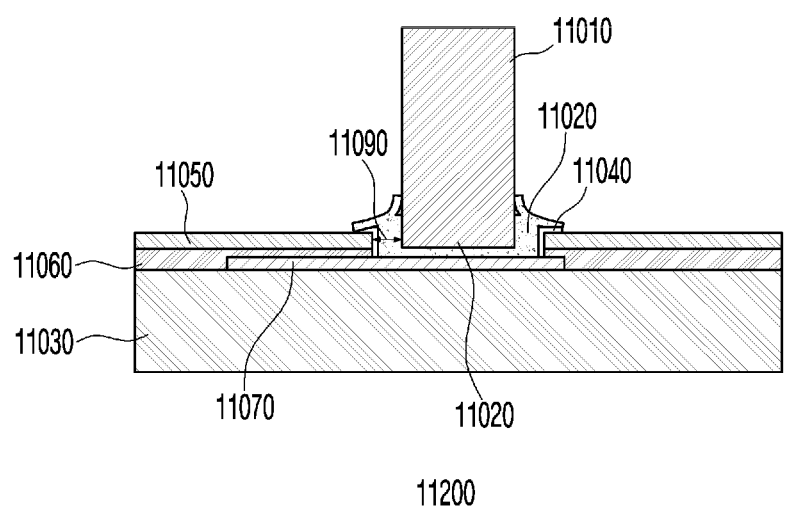
11200

[Fig. 12]
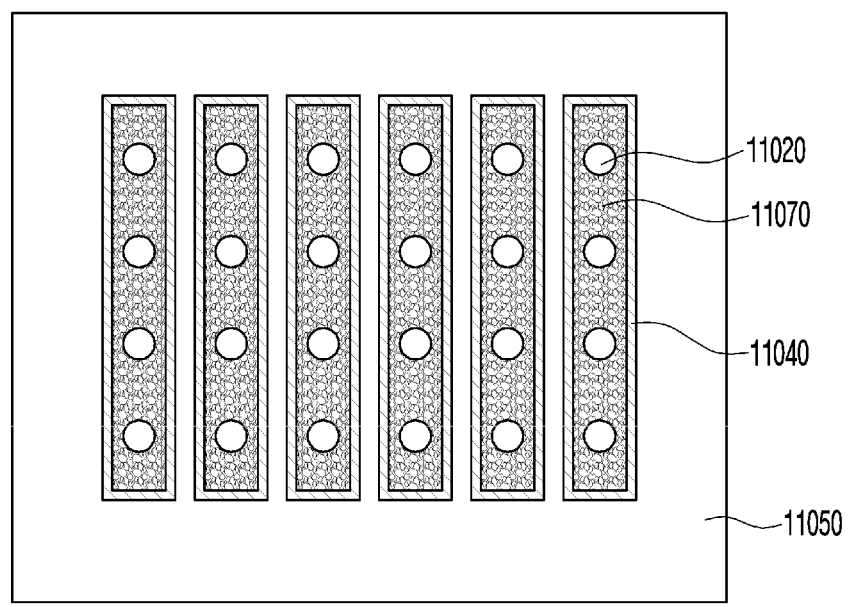

MULTILAYERED CERAMIC SUBSTRATE AND METHOD FOR MANUFACTURING SAME

FIELD

The present disclosure relates to a multilayer ceramic substrate and preparation method thereof.

BACKGROUND

In light of the recent trend where electronic devices are increasingly becoming lighter, thinner, shorter and smaller, and where films are increasingly becoming thinner, together with the recent technological development of the electronic devices, integration of components has become essential, and for the integration of such components, multilayer ceramic substrates are being prepared by laminating multiple ceramic sheets. Further, these multilayer ceramic substrates are being widely used as alternatives to printed circuit boards (PCB) due to their thermal resistance, abrasion resistance and excellent electrical characteristics, and the demand for these multilayer ceramic substrates is increasing.

The multilayer ceramic substrate is generally prepared by a method called the green sheet lamination method. This is a method of molding a slurry from ceramic powder and organic binder in a tape casting method, to prepare a ceramic green sheet; forming via halls in the ceramic green sheet by punching the prepared ceramic green sheet; filling the holes with conductive paste; screen-printing conductive paste on a sheet surface; laminating as many of the ceramic green sheets as necessary and heating and pressurizing the same to prepare a laminate; and then firing the laminate in a certain temperature.

However, in the process of being fired and cooled, the laminate goes through thermal expansion and thermal contraction, and accordingly, in the ceramic thin films that constitute the laminate, defects such as cracks, bending, gaps, delamination phenomenon and the like may occur. Moreover, since not all areas of the laminate are exposed to an identical temperature, different layers of the laminate will have different degrees of thermal expansion and thermal contraction, and further, even amongst the same layer, different areas of the ceramic thin film will have different thermal expansion and thermal contraction. Therefore, the degree of defect will differ depending on which layer of the laminate it is and depending on which area of the ceramic thin film it is. In addition, due to this reason, the via halls in each layer which had been aligned before firing the laminate, may become misaligned, also causing defects in conductivity between the layers.

Further, in the process of firing the laminate, besides the defects that occur in the ceramic thin film itself, defects may also occur in an inner electrode and outer electrode formed on the ceramic thin film, in which case whether a defect has occurred may only be confirmed after the laminate is fired. Therefore, there is also a problem that, if such a defect occurs, the entire laminate has to be discarded.

Further, the conductive paste printed layer formed on a surface of the ceramic green sheet is disposed between the layers of the green sheets when the green sheets are laminated, thereby forming inner electrodes of the multilayer ceramic substrate that is finally obtained. Here, due to the thickness of the inner electrode, there occurs a gap between the layers of the multilayer ceramic substrate. Such a gap may subsequently cause defects such as substrate cracks and the like. Moreover, there may occur a difference of height between a portion inside the multilayer ceramic substrate that has the inner electrode and a portion inside the multilayer ceramic substrate that does not have the inner electrode, causing a problem where the surface evenness of the substrate deteriorates.

Moreover, prior art green sheet lamination methods create a multilayer ceramic substrate by laminating the green sheets, and then firing the entire laminate at a certain temperature in a lump sum.

Therefore, all the green sheets of the layers constituting the laminate must have an identical material so that they react at the same temperature, thus leading to a problem where the multilayer ceramic substrates cannot be made with various materials.

To talk about probe cards, semiconductor integrated circuit devices are generally formed by packaging a plurality of integrated circuit chips extremely intricately and exquisitely. Whether there is a defect in such semiconductor integrated circuits is tested by performing electrical characteristics tests on the semiconductor integrated circuits, wherein a test device called probe card is generally used. The probe card plays the role of electrically connecting a wafer of the semiconductor integrated circuit and a tester. The probe card largely consists of a space transformer and a probe pin. Especially, the space transformer plays the role of immobilizing a probe pin contacting a bond pad of a chip of the semiconductor integrated circuit and connecting the probe pin to a main board of the probe card.

Such a space transformer consists of a multilayer ceramic substrate, and a polyimide layer laminated on top of the multilayer ceramic substrate. Such a space transformer of prior art is prepared in the multilayer ceramic simultaneous sintering method using a ceramic green sheet, and therefore, the production cost per unit is expensive. Further, the contraction and expansion of the ceramic sheet caused by high temperature processing may deform the product, which deteriorates the product yield. This leads to a bridging electrical, which makes it impossible to perform a proper semiconductor integrated circuit test. Further, such a distortion in the ceramic thin film causes an evenness defect, leading to an evenness defect in the probe pin contacting the space transformer. Therefore, there may occur an area in the semiconductor integrated circuit that does not contact the probe pin, making it impossible to perform a proper test. Further, such a space transformer of prior art has on a top surface of the polyimide a bonding pad formed for bonding the probe pin. And through laser irradiation, the probe pin is individually bonded to the bonding pad exquisitely. Therefore, the prior art method had problems since it required expensive equipment for bonding the probe pin, and a lot of time to bond tens of thousands of pins. In addition, as the test is performed numerous times, the durability of the bonding portion of the probe pin and the bonding pad may become weaker, leading to a problem where the probe pin easily falls off from the bonding pad. Moreover, there is also a problem where repair work through laser irradiation becomes necessary in order to bond one by one the probe pins that had fallen off from the bonding pad, for which manpower and a lot of repair time has to be input.

SUMMARY

A purpose of the present disclosure is to resolve the aforementioned problems, that is, to provide a multilayer ceramic substrate preparation method that prevents via halls of each layer from being misaligned during the process of preparing the multilayer ceramic substrate, and to provide the multilayer ceramic substrate prepared by the same method.

Another purpose of the present disclosure is to provide a multilayer ceramic substrate preparation method that is capable of checking and repairing a defect that occurred in each layer during the process of preparing the multilayer ceramic substrate before the completion of preparation of the multilayer ceramic substrate, and to provide the multilayer ceramic substrate prepared by the same method.

Another purpose of the present disclosure is to provide a multilayer ceramic substrate preparation method that prevents a height difference from occurring due to an inner electrode being formed between the layers of the multilayer ceramic substrate, and to provide the multilayer ceramic substrate prepared by the same method.

Another purpose of the present disclosure is to provide a multilayer ceramic preparation method where various materials may be used to constitute each layer of the multilayer ceramic substrate, and to provide the multilayer ceramic substrate prepared by the same method.

Another purpose of the present disclosure is to provide a space transformer preparation method that may reduce the evenness defects of the probe pin contacting the space transformer, and to provide the space transformer prepared by the same method.

Another purpose of the present disclosure is to provide a space transformer preparation method for reinforcing the durability of the probe pin contacting the space transformer, cost reduction and easy repair, and to provide the multilayer ceramic substrate prepared by the same method.

In order to achieve the aforementioned purposes, a multilayer ceramic substrate preparation method according to an embodiment of the present disclosure may include firing a plurality of ceramic green sheets, to create a plurality of ceramic thin films; forming a via hall in each of the plurality of ceramic thin films; filling the via hall of each of the plurality of ceramic thin films with conductive paste, and heat treating the via hall filled with the conductive paste, to form a via electrode; printing a pattern on a cross section of each of the plurality of ceramic thin films, and heat treating the printed pattern, to form an inner electrode; applying a bonding agent on the cross section of each of the ceramic thin films avoiding the via halls, excluding an uppermost ceramic thin film of the plurality of ceramic thin films; aligning and laminating each of the plurality of ceramic thin films such that each of the plurality of ceramic thin films is electrically connected through the via electrode and the inner electrode; and firing or heat treating the laminated plurality of ceramic thin films.

Desirably, the conductive paste may include a glass component, and the laminated plurality of ceramic thin films may be heat treated at a temperature that is higher than a melting point of the bonding agent and lower than a melting point of the ceramic thin films and a melting point of the conductive paste.

Desirably, if there is a conductivity problem as a result of testing the conductivity of the via electrode or the inner electrode, the conductive paste of the via hall or the conductive paste of the pattern may be etched using an etching solution, and the via hall may be refilled or the pattern may be re-printed.

Desirably, a thickness of each of the plurality of ceramic thin films may be 10 to 500 microns, and a thickness of a bonding layer that the bonding agent forms may be 2 to 100 microns, and a diameter of each of the plurality of ceramic thin films may be 12 inches or above.

According to another embodiment of the present disclosure, a multilayer ceramic substrate formed by laminating a plurality of ceramic thin films may be provided, wherein the plurality of ceramic thin films may be created by firing a plurality of ceramic green sheets, each of the plurality of ceramic thin films may include a via electrode and an inner electrode, the via electrode may be formed by filling a via hall formed in each of the plurality of ceramic thin films with conductive paste and heat treating the via hall filled with the conductive paste, the inner electrode may be formed by printing a pattern on a cross section of each of the plurality of ceramic thin films with conductive paste and heat treating the printed pattern, and the multilayer ceramic substrate may be created by applying a bonding agent on the cross section of each of the ceramic thin films avoiding the via halls excluding an uppermost ceramic thin film of the plurality of ceramic thin films, aligning and laminating the plurality of ceramic thin films such that each of the plurality of ceramic thin films is electrically connected through the via electrode and the inner electrode, and firing or heat treating the laminated plurality of ceramic thin films.

The present disclosure may provide a multilayer ceramic substrate preparation method that prevents via halls of each layer from being misaligned during the process of preparing the multilayer ceramic substrate, and the multilayer ceramic substrate prepared by the same method.

The present disclosure may provide a multilayer ceramic substrate preparation method that is capable of checking and repairing a defect that occurred in each layer during the process of preparing the multilayer ceramic substrate before the completion of preparation of the multilayer ceramic substrate, and the multilayer ceramic substrate prepared by the same method.

The present disclosure may provide a multilayer ceramic substrate preparation method that prevents a height difference from occurring due to an inner electrode being formed between the layers of the multilayer ceramic substrate, and the multilayer ceramic substrate prepared by the same method.

The present disclosure may provide a multilayer ceramic preparation method where various materials may be used to constitute each layer of the multilayer ceramic substrate, and the multilayer ceramic substrate prepared by the same method.

The present disclosure may provide a space transformer preparation method that may reduce the evenness defects of the probe pin contacting the space transformer and provide the space transformer prepared by the same method.

The present disclosure may provide a space transformer preparation method for reinforcing the durability of the probe pin contacting the space transformer, cost reduction and easy repair, and the multilayer ceramic substrate prepared by the same method.

BRIEF DESCRIPTION OF THE DRAWINGS

FIG. 1 is a view illustrating a ceramic thin film preparation method according to an embodiment of the present disclosure;

FIG. 2 is a view illustrating a multilayer ceramic substrate preparation method according to an embodiment of the present disclosure;

FIG. 3 is a view illustrating a multilayer ceramic substrate preparation method according to another embodiment of the present disclosure;

FIG. 4 is a view illustrating the configuration of the multilayer ceramic substrate prepared according to the embodiment of FIG. 3;

FIG. 5 is a view illustrating a multilayer ceramic substrate preparation method according to another embodiment of the present disclosure;

FIG. 6 is a view illustrating a multilayer ceramic substrate according to another embodiment of the present disclosure;

FIG. 7 is a view illustrating the configuration of the multilayer ceramic substrate prepared according to the embodiment of FIG. 5 or FIG. 6;

FIG. 8 is a view illustrating a multilayer ceramic substrate preparation method according to an embodiment of the present disclosure;

FIG. 9 is a view illustrating the configuration of the multilayer ceramic substrate prepared according to the embodiment of FIG. 8;

FIG. 10 is a view illustrating a space transformer preparation method according to an embodiment of the present disclosure;

FIG. 11 is a front view of the space transformer prepared according to the embodiment of the FIG. 10; and FIG. 12 is a top view of the space transformer prepared according to the embodiment of FIG. 10.

DETAILED DESCRIPTION

Hereinbelow, specific contents for implementing the present disclosure will be explained with reference to the drawings attached. Further, in explaining the present disclosure, if any matter that is obvious to a person skilled in the art such as a related publicly known function and the like is deemed to unnecessarily obscure the substance of the present disclosure, detailed explanation thereof will be omitted.

First, the terms used in the present specification are defined as below.

A ceramic material refers to a nonmetal inorganic material that may be obtained through a heat treatment process. Ceramic may be referred to as ceramics.

Firing refers to a process of heating a mixed raw material at a high temperature to prepare a thermosetting material having a firm and compact structure. That is, firing refers to a process of heating the mixed raw material to prepare a compound having different properties.

Heat treatment refers to heating a matter within the range of not changing the properties of that matter with the purpose to give original functions of the matter.

A via hall refers to a plated through hall that is used within a multilayer print wiring substrate to connect two or more layers of inner conductors without inserting a component. The plated through hall refers to a hole formed by educing out the metal from a wall surface in order to conduct a through connection in the print wiring substrate. The via hall may be referred to as a penetrating hall as well.

Conductive paste refers to a composite material in a state where conductive powder, binder and the like are dispersed in a resin solution having liquidity.

Etching refers to corroding a surface made of metal, ceramics, semiconductor and the like using a chemical agent.

A probe card refers to a device that connects a semiconductor chip and a testing equipment in order to test the operations of the semiconductor. A probe needle mounted onto the probe card sends electricity as it contacts the wafer, and a returning signal in response to that may identify a defective semiconductor chip.

Electrostatic discharge (ESD) refers to an electrostatic phenomenon where the electrons accumulated in an object escape from the object due to friction occurring as the object contacts another object.

Multilayer ceramic substrate refers to a substrate where thin films made of a ceramic material are overlapped in multilayers so that the layers are electrically connected to each other. The multilayer ceramic substrate may be referred to as multi-layer ceramic (MLC). The multilayer ceramic substrate consists of a plurality of ceramic thin films. In the present specification, a ceramic thin film may refer to one layer of ceramic thin film.

Green sheet refers to what is made by suspending aluminum powder and the like in a solvent, plasticizer and the like, and then drying the same in the shape of a sheet. Ceramic green sheet refers to a green sheet made using ceramic powder.

Ceramic Thin Film and Method for Preparing the Same

Referring to FIG. 1, a ceramic thin film and a method for preparing the same according to an embodiment of the present disclosure will be explained.

FIG. 1 is a view illustrating the ceramic thin film preparation method according to an embodiment of the present disclosure.

According to an embodiment of the present disclosure, in order to prepare a ceramic thin film, first of all, ceramic powder may be prepared. Ceramic powder may be any one of LTCC, mullite, BaO, $SiO_2$, $Al_2O_3$, $B_2O_3$, and CaO, or two or more kinds of such ceramic powder may be mixed and prepared. The ceramic powder is mixed with a binder, plasticizer and organic solvent, to make a slurry, and then the slurry is cast to a sheet phase. The method for making a ceramic sheet is well known, and thus the ceramic sheet may be prepared in the well-known method, or commercialized ceramic sheets may be used. That is, ceramic sheets are distributed in the form where they are bonded to release papers such as PET films. The thickness of the ceramic sheet may be 5 to 200 microns (um). In the case of preparing an MLC for the use of probe cards, conventionally, via halls used to be formed in the ceramic sheet through laser processing, and then conductive paste would be filled inside the via halls, to form a pattern using the conductive paste, and then multiple layers would be compressed and attached, followed by an isotropic firing. However, the success rate of isotropic firing was extremely low, leading to a low product yield, as mentioned above.

However, the embodiment of the present disclosure fires the ceramic sheet first to obtain the ceramic thin film, and then subsequently conducts the necessary processing on the ceramic thin film. It is not possible to obtain a ceramic thin film which maintains an even surface by firing a thin ceramic sheet. In the firing process, variables such as the temperature, pressure and the like of all the surfaces of the ceramic sheet must be identical. That is because, in the process of cooling from high temperature firing at around 1500° C. to room temperature, in order to prevent any deformation due to stress and form an even surface, the thermodynamic variables of the particle components or the thermal activities of the constituent particles of the ceramic sheet must be identical. That is, when a thin ceramic sheet is fired in a general firing process, thin ceramic thin films that have thickness of below 200 microns may undergo stress, and thus most of them end up having deformed conditions such as cracks, wrinkles and the like. Therefore, the embodiment of the present disclosure contrived the following firing method that is capable of preparing a ceramic thin film with a thickness of 20 to 250 microns having a uniform even surface.

According to an embodiment of the present disclosure, in order to prepare a ceramic thin film, first of all, a ceramic surface plate having an even surface is prepared. A ceramic sheet is placed on top of the surface plate. Here, the surface area of the surface plate should be greater than that of the sheet, creating a margin area. A pillar (spacer) is disposed on the margin area. Another surface plate is placed on an upper end of the pillar. The height of the pillar, that is, the distance between the surface plates should be greater than the thickness of the ceramic sheet but as small as possible. The height of the pillar may be, for example, 50 to 1000 microns. Moreover, since it is productive to fire multiple ceramic sheets at the same time, the abovementioned process should be repeated by placing another ceramic sheet on top of the surface plate, and then placing another ceramic sheet on top of that and so forth. Upon disposing the ceramic sheets between the surface plates, firing is conducted at a high temperature of 1000 to 1600° C. The duration of firing may differ depending on the surface areas and/or the number of the ceramic sheets. For example, when firing one piece of ceramic sheet that is 12 inches wide and 12 inches long, the high temperature firing may last 1 to 5 hours. The abovementioned firing may be conducted under an oxygen free reduction atmosphere or air atmosphere. Such firing method is capable of creating a uniform temperature and pressure distribution for thin ceramic sheets, thereby preventing thermal stress, and further, after the high temperature firing, this method adjusts the cooling step, which resolves the deformation problem caused by thermal contraction, and thus providing a ceramic thin film having a very uniform even surface. The thickness of such a ceramic thin film having a uniform even surface prepared as aforementioned may reach an extremely thin level of approximately 20 microns. Since the ceramic thin film has a very small thickness, but at the same time, it is not a sheet but has a rigid plate form that is a fired firm substrate, the degree of precision of any post-processing will be significantly improved while facilitating the handling of the ceramic thin film as well. In the aforementioned case of the multilayer ceramic substrate for use of probe card, using a ceramic thin film having a thickness of approximately 80 microns fired and prepared as above may lead to achieving an extremely high yield.

Multilayer Ceramic Substrate and Method for Preparing the Same

Referring to FIG. 2, a multilayer ceramic substrate and a method for preparing the same according to an embodiment of the present disclosure will be explained.

FIG. 2 is a view illustrating the multilayer ceramic substrate preparation method according to an embodiment of the present disclosure.

Through laser processing, via halls are formed in each layer of the ceramic thin film prepared according to an embodiment of the present disclosure, and then the via halls of each layer are filled with conductive paste. Here, the conductive paste may include any one of Ag, Cu, Au, Pd, Pt, Ag—Pd, Ni, Mo, and W, and desirably, Ag. The firing need not be conducted under an oxygen free environment. In the case of using Ag as the conductive paste, the conductive paste, Ag, may be fired under an air atmosphere, at approximately 700° C. to 900° C., and desirably at approximately 800° C. The duration of firing may differ depending on the number and surface area of the substrates, and in the case of one piece of multilayer ceramic substrate that is 12 inches wide and 12 inches long, the firing may last 0.5 to 2 hours.

Good quality/defect rates of the via halls of each layer filled with conductive paste are tested by vision. The good quality products may proceed to the next step, whereas the defective products are stripped of conductor by etching, and then sent for recycling. The good quality products are heat treated per layer for the via halls, and then a conductive pattern is printed per layer to test the good quality/defect rates by vision. As for the good quality products, the printed conductive pattern may be heat treated and then the products proceed to the next step, whereas the defective products may be stripped of the conductor by etching, and then sent for recycling. As for the good quality products, a bonding material is printed per layer, the layers are aligned for laminate bonding, and then the bonded laminate is heat treated. The completed laminate is tested for electrical and mechanical properties.

A multilayer ceramic substrate may be supplied stably in the abovementioned method. Further, the aforementioned ceramic thin film processing method may be widely applied where processed ceramic thin films are needed besides just the multilayer ceramic substrates for use of probe cards. Such a multilayer ceramic substrate preparation method shows extremely high yields, and when a problem occurs in the process of firing the conductive paste, the conductor area of the corresponding layer may be etch-removed using an etching solution and the ceramic thin films may be recycled, and thus it is all the more efficient. The etching solution that etches only the metal and not the ceramic is widely known in the related art, and thus will not be particularly limited herein.

Referring to FIGS. 3 and 4, a multilayer ceramic substrate and a method for preparing the same according to another embodiment of the present disclosure will be explained.

FIG. 3 is a view illustrating a multilayer ceramic substrate preparation method according to another embodiment of the present disclosure.

The multilayer ceramic substrate preparation method according to another embodiment of the present disclosure includes the following steps: (1) firing a plurality of ceramic green sheets to create a plurality of ceramic thin films, (2) forming a via hall in each of the plurality of ceramic thin films, (3) filling the via hall of each of the plurality of ceramic thin films with conductive paste, and heat treating the via halls filled with the conductive paste, to form via electrodes, (4) printing a pattern on a cross section of each of the plurality of ceramic thin films with conductive paste, and heat treating the printed pattern, to form inner electrodes, (5) applying a bonding agent on the cross section of each of the ceramic thin films avoiding the via halls excluding an uppermost ceramic thin film of the plurality of ceramic thin films, (6) aligning and laminating each of the plurality of ceramic thin films such that each of the plurality of ceramic thin films is electrically connected through the via electrode and the inner electrode, and (7) heat treating the laminated plurality of ceramic thin films.

At step (1), the embodiment of the present disclosure may fire the plurality of ceramic green sheets, to create the plurality of ceramic thin films. That is, the embodiment of the present disclosure may create the plurality of ceramic thin films in the form of creating one ceramic thin film by firing one ceramic green sheet and creating another ceramic thin film by firing another ceramic green sheet. At this step, the firing temperature may be 1000 to 1500° C. Moreover, the ceramic green sheet may have a thickness of 50 to 600 microns, and the ceramic thin film may have a thickness of 10 to 500 microns. Further, the diameter of the ceramic green sheet and the ceramic thin film may be 12 inches or above. Moreover, at this step, the embodiment of the present disclosure may fire the ceramic green sheet under an oxygen free reduction environment or atmosphere environment for 1 to 5 hours.

At step (2), the embodiment of the present disclosure may form the via hall in each of the plurality of ceramic thin films. The embodiment of the present disclosure may form one or more via halls in one ceramic thin film. Here, the via hall may be formed through a process such as laser irradiation, chemical etching and the like. Moreover, the diameter of the via hall may be 30 to 200 microns. According to another embodiment of the present disclosure, the via halls formed in one layer may have the same size. Specifically, the reason why the via halls formed in one layer may have the same size is because the ceramic thin films are created independently per layer and then laminated, and thus the problem of prior art where the via halls of each layer used to end up being misaligned has been resolved. In prior art, in order to prevent the problem of misalignment of via halls that occurs in the process of laminating the ceramic green sheets and then firing the laminate in a lump sum, the via halls used to be made bigger where distortion is severe while the via halls used to be made smaller where distortion is relatively less severe. Such a process in prior art made designing the via halls difficult as the via halls had to be designed in various sizes and there was inconvenience in terms of cost and/or duration.

At step (3), the embodiment of the present disclosure may form the via electrodes by filling the via hall of each of the plurality of ceramic thin films with conductive paste, and then heat treating the via halls filled with the conductive paste. Here, the reason for filling the conductive paste in the via halls of the ceramic thin films is for the sake of the electrical connection between the plurality of ceramic thin films that will be accumulated afterwards, layer by layer. Moreover, the conductor used as the conductive paste at this step may be any one of Ag, Cu, Au, Pd, Pt, Ag—Pd, Ni, Mo, and W.

At step (4), the embodiment of the present disclosure may print the pattern on the cross section of each of the plurality of ceramic thin films using the conductive paste. Here, different patterns may be printed on different ceramic thin films. Here, the pattern which has been printed and heat treated may correspond to the inner electrode. According to the embodiment of the present disclosure, the thickness of the inner electrode may be 1 to 10 microns.

At step (5), the embodiment of the present disclosure may apply the bonding agent on the cross section of each of the ceramic thin films avoiding the via halls excluding the uppermost ceramic thin film of the plurality of ceramic thin films. Here, the uppermost ceramic thin film may mean the ceramic thin film to be positioned on the uppermost layer when the plurality of ceramic thin films are accumulated, layer by layer. In addition, the bonding agent to be applied on the pattern may be a material that does not affect the pattern printed on the cross section of the ceramic thin film. Moreover, the bonding agent may be used to bond the ceramic thin films that will be laminated subsequently. Further, the bonding agent may be inorganic and/or organic, and the inorganic bonding agent may include glass, ceramic and the like, while the organic bonding agent may include epoxy and the like. According to the embodiment of the present disclosure, the bonding agent may form a bonding layer, and the thickness of the bonding layer may be 2 to 100 microns.

At step (6), the embodiment of the present disclosure may align and accumulate (laminate) each of the plurality of ceramic thin films, layer by layer, such that each of the plurality of ceramic thin films is electrically connected through the via electrode and the inner electrode. That is, the pattern printed on a surface of one layer of ceramic thin film may be electrically connected with another pattern printed on a surface of another layer of ceramic thin film through the via hall. In other words, the inner electrode of one layer may be electrically connected with the inner electrode of a lower layer through the via electrode on its layer, while the inner electrode of one layer may be electrically connected with the inner electrode of an upper layer through the via electrode of the upper layer. Finally, an input end electrode on a lowermost layer and a probe pin terminal, that is an uppermost measured end, may be electrically connected.

At step (7), the embodiment of the present disclosure may fire or heat treat the laminated plurality of ceramic thin films. That is, the embodiment of the present disclosure may bond the plurality of ceramic thin films with each other by firing or heat treating the laminated plurality of ceramic thin films and melting the bonding agent applied on the cross section of each of the plurality of ceramic thin films. Here, the melting point of the bonding agent may differ depending on the material constituting the bonding agent. Moreover, in this process, in order to prevent the ceramic thin films, the pattern printed on the ceramic thin films and/or the conductive paste filled in the via halls of the ceramic thin films from melting, the melting point of the bonding agent may be lower than the melting point of the ceramic thin films, the melting point of the conductive paste used in the pattern printing (the melting point of the inner electrode material), and the melting point of the conductive paste filled in the via halls. Here, the melting point of the ceramic thin films may differ depending on the material constituting the ceramic thin films. Therefore, the embodiment of the present disclosure may fire or heat treat the laminated plurality of ceramic thin films at a temperature that is higher than the melting point of the bonding agent and that is lower than the melting point of the ceramic thin films. That is, the embodiment of the present disclosure may prevent defects such as cracks and the like from occurring on the ceramic thin films themselves by firing or heat treating the laminated plurality of ceramic thin films at a temperature that does not affect the ceramic thin films.

For example, the embodiment of the present disclosure may fire or heat treat the laminated plurality of ceramic thin films under an atmosphere environment at 600° C. to 900° C., or desirably at 800° C. Here, the duration of firing or heat treatment may differ depending on the number and surface area of the laminated plurality of ceramic thin films. For example, in a case where the diameter of each of the laminated plurality of ceramic thin films is 12 inches, the embodiment of the present disclosure may fire or heat treat the laminated plurality of ceramic thin films for 0.5 to 2 hours. The embodiment of the present disclosure may prepare the multilayer ceramic substrate through steps (1) to (7).

Moreover, after step (3) and/or step (4), the embodiment of the present disclosure may test the conductivity of the via hall and/or pattern of each of the plurality of ceramic thin films. If the test result shows that there is a problem in conductivity, the embodiment of the present disclosure may etch the conductive paste used in the via hall and/or pattern using an etching solution and perform step (3) and/or step (4) again. Here, the etching solution may etch only the conductive paste and not the ceramic thin film.

According to another embodiment of the present disclosure, the conductive paste used in the inner electrode or via electrode may include 0 to 20 percent of glass components. In this case, the bonding agent may be applied on top of the ceramic thin film avoiding the inner electrode and the via electrode. When the bonding agent is applied, and the plurality of ceramic thin films are laminated and then heat treated, some of the glass components included in the inner electrode may be expressed on an upper surface of the conductive paste to form a thin glass layer, thereby bonding the plurality of ceramic thin films more firmly. Moreover, some of the glass components included in the inner electrode exists in a lower portion of the conductive paste, thereby reinforcing the adhesive strength between the ceramic thin film and the inner electrode on that layer.

Another embodiment of the present disclosure may form a bonding layer by applying the bonding agent on the cross section of the ceramic thin film avoiding the via halls, and in the positions of the via halls, by filling the conductive paste as much as the thickness of the bonding layer, the plurality of ceramic thin films may be electrically connected.

FIG. 4 is a view illustrating the configuration of the multilayer ceramic substrate prepared according to the embodiment of FIG. 3.

The multilayer ceramic substrate according to the embodiment of the present disclosure 4010 may include a laminated plurality of ceramic thin films 4020. In addition, each of the plurality of ceramic thin films 4020 may include a via electrode 4030 and an inner electrode 4040. Here, the via electrode may be formed by filling conductive paste in the via halls formed in each of the plurality of ceramic thin films and heat treating the via halls filled with the conductive paste, and the inner electrode may be formed by printing a pattern on the cross section of each of the plurality of ceramic thin films with the conductive paste and heat treating the printed pattern.

The plurality of ceramic thin films may be formed by firing a plurality of ceramic green sheets, and the multilayer ceramic substrate may be formed by applying a bonding agent on the cross section of each of the ceramic thin films avoiding the via halls excluding the uppermost ceramic thin film of the plurality of ceramic thin films, aligning and laminating the plurality of ceramic thin films such that each of the plurality of ceramic thin films is electrically connected through the via electrode and the inner electrode, and firing or heat treating the laminated plurality of ceramic thin films. Detailed explanation of the multilayer ceramic substrate preparation method is as mentioned above with reference to FIG. 3.

Referring to FIG. 5, a multilayer ceramic substrate and a method for preparing the same according to another embodiment of the present disclosure will be explained.

FIG. 5 is a view illustrating the multilayer ceramic substrate preparation method according to another embodiment of the present disclosure.

The multilayer ceramic substrate preparation method according to another embodiment of the present disclosure includes the following steps: (1) firing a plurality of ceramic green sheets, to create a plurality of ceramic thin films, (2) forming a via hall in each of the plurality of ceramic thin films, (3) filling the via hall of each of the plurality of ceramic thin films with conductive paste, and heat treating the via halls filled with the conductive paste, to form via electrodes, (4) printing a pattern on a cross section of each of the ceramic thin films with conductive paste excluding an uppermost ceramic thin film of the plurality of ceramic thin films, and heat treating each printed pattern, to form inner electrodes, (5) applying a bonding agent on the cross section of each of the ceramic thin films avoiding the via halls excluding the uppermost ceramic thin film of the plurality of ceramic thin films, (6) aligning and laminating each of the plurality of ceramic thin films such that each of the plurality of ceramic thin films is electrically connected through the via electrode and the inner electrode, (7) firing or heat treating the laminated plurality of ceramic thin films, (8) forming an outer electrode on the cross section of the uppermost ceramic thin film, and (9) forming an outer electrode on an opposite surface of the cross section where the pattern of the uppermost ceramic thin film of the plurality of ceramic thin films is printed.

Explanation on the above steps (1), (2), (5), (6) and (7) will be substituted by the above explanation made regarding each corresponding step of the embodiment with reference to FIG. 3.

At step (3), the embodiment of the present disclosure may fill the via hall of each of the plurality of ceramic thin films with the conductive paste, and heat treat the via hall, to form the via electrode. Here, the via electrode may mean the via hall itself filled with the conductive paste.

At step (4), the embodiment of the present disclosure may print the pattern on the cross section of each of the ceramic thin films with the conductive paste excluding the uppermost ceramic thin film of the plurality of ceramic thin films, and heat treat the printed pattern, to form the inner electrode. Here, the inner electrode may mean the pattern printed on the cross section of the ceramic thin film itself. Moreover, the inner electrode may be electrically connected with the via electrode. That is, at this step, the embodiment of the present disclosure may not print the pattern on the uppermost ceramic thin film.

At step (8), the embodiment of the present disclosure may print the outer electrode on a surface of the uppermost ceramic thin film. That is, the embodiment of the present disclosure may laminate, fire or heat treat the plurality of ceramic thin films, and then form the outer electrode on the surface of the uppermost ceramic thin film. Here, the outer electrode may be an electrode exposed outside the plurality of ceramic thin films and may be formed by applying the conductive paste and the like.

At step (9), the embodiment of the present disclosure may form the outer electrode on the opposite surface of the cross section where the pattern of a lowermost ceramic thin film of the plurality of ceramic thin films is pre-printed. Here, the lowermost ceramic thin film may mean the ceramic thin film positioned in the lowermost layer of the laminated plurality of ceramic thin films. Here, the outer electrode may be an electrode exposed outside the plurality of ceramic thin films and may be formed by applying the conductive paste and the like. That is, the embodiment of the present disclosure may laminate the plurality of ceramic thin films, fire or heat treat the laminated plurality of ceramic thin films, and then print the outer electrode on the outer cross section of the lowermost ceramic thin film in line with the position of the via electrode. Thus, the embodiment of the present disclosure may electrically connect the outer electrode of the uppermost ceramic thin film of the multilayer ceramic substrate and the outer electrode of the lowermost ceramic thin film through the via electrode existing on each layer of ceramic thin film. Consequently, the outer electrode of the uppermost ceramic thin film, the outer electrode of the lowermost ceramic thin film, and the inner electrode of each layer may be electrically connected through the via electrode of each layer. The embodiment of the present disclosure may prepare the multilayer ceramic substrate through steps (1) to (9).

Referring to FIG. 6, a multilayer ceramic substrate and a method for preparing the same according to another embodiment of the present disclosure will be explained.

FIG. 6 is a view illustrating the multilayer ceramic substrate preparation method according to another embodiment of the present disclosure.

The multilayer ceramic substrate preparation method according to another embodiment of the present disclosure includes the following steps: (1) firing a plurality of ceramic green sheets to create a plurality of ceramic thin films, (2) forming a via hall in each of the plurality of ceramic thin films, (3) filling the via hall of each of the plurality of ceramic thin films with conductive paste, and heat treating the via halls filled with the conductive paste, to form via electrodes, (4) printing a pattern on a cross section of each of the ceramic thin films with conductive paste excluding an uppermost ceramic thin film of the plurality of ceramic thin films, and heat treating each printed pattern, to form inner electrodes, (5) forming an outer electrode on the cross section of the uppermost ceramic thin film, (6) forming an outer electrode on an opposite surface of the cross section where the inner electrode of a lowermost ceramic thin film of the plurality of ceramic thin films is formed, (7) applying a bonding agent on the cross section of each of the ceramic thin films avoiding the via halls excluding the uppermost ceramic thin film of the plurality of ceramic thin films, (8) aligning and laminating each of the plurality of ceramic thin films such that each of the plurality of ceramic thin films is electrically connected through the via electrode, the inner electrode and the outer electrode, and (9) firing or heat treating the laminated plurality of ceramic thin films.

Unlike the embodiment explained above with reference to FIG. 5, this embodiment of the present disclosure may form the outer electrode on the cross section of the uppermost ceramic thin film and the lowermost ceramic thin film before laminating the plurality of ceramic thin films. Explanation on the remaining steps of the present embodiment will be substituted by the explanation made on the corresponding steps of the embodiment with reference to FIG. 5.

FIG. 7 is a view illustrating the configuration of the multilayer ceramic substrate prepared according to the embodiment of FIG. 5 or FIG. 6.

The multilayer ceramic substrate according to the embodiment of the present disclosure 7010 may include a laminated plurality of ceramic thin films 7020, 7030, 7040. Further, the plurality of ceramic thin films may include the uppermost ceramic thin film 7030 and the lowermost ceramic thin film 7040. Moreover, each of the ceramic thin films 7020 positioned inside the multilayer ceramic substrate may include a via electrode 7050 and/or inner electrode 7060, and the uppermost ceramic thin film 7030 and the lowermost ceramic film 7040 positioned in outermost areas of the multilayer ceramic substrate may include a via electrode 7050, inner electrode 7060 and/or outer electrode 7070.

Detailed explanation on the above multilayer ceramic substrate will be substituted by the explanation made with reference to FIG. 5 and FIG. 6.

Multilayer Ceramic Substrate Having Layers Made of Different Materials and Method for Preparing the Same Referring to FIG. 8 and FIG. 9, the multilayer ceramic substrate and the method for preparing the same according to an embodiment of the present disclosure will be explained.

FIG. 8 is a view illustrating the multilayer ceramic substrate preparation method according to an embodiment of the present disclosure.

The multilayer ceramic substrate preparation method according to the embodiment of the present disclosure includes the following steps: (1) firing a plurality of first ceramic green sheets to create a plurality of first ceramic thin films, (2) firing a second ceramic green sheet having a material that is different from that of the first ceramic green sheet, to form a second ceramic thin film, (3) forming a via hall in each of the plurality of first ceramic thin films and the second ceramic thin films, (4) filling the via hall of each of the plurality of first ceramic thin films and the second ceramic thin films with conductive paste, and heat treating the via halls filled with the conductive paste, to form via electrodes, (5) printing a pattern on a cross section of each of the plurality of first ceramic thin films and the second ceramic thin films with conductive paste, and heat treating each printed pattern, to form inner electrodes, (6) applying a bonding agent on the cross section of each of the ceramic thin films avoiding the via halls excluding an uppermost ceramic thin film of the plurality of first ceramic thin films and the second ceramic thin films, (7) aligning and laminating each of the plurality of first ceramic thin films and the second ceramic thin films such that each of the plurality of first ceramic thin films and the second ceramic thin films are electrically connected through the via electrode and the inner electrode, and (8) firing or heat treating the laminated plurality of first ceramic thin films and the second ceramic thin films.

At step (2), according to the embodiment of the present disclosure, the second ceramic thin film may have a material having different electrical properties than that of the first ceramic thin film. For example, in a case where the pattern printed on a certain layer is complicated, by using a ceramic thin film having a material having a dielectric permittivity that is only appropriate to that certain layer, it is possible to easily design the pattern of that layer while maintaining the thickness of the ceramic thin film and the surface area of the pattern to be identical to those of other layers. For another example, a prepared multilayer ceramic substrate must have an impedance value of a certain range, but in the case of a multilayer ceramic substrate where all the layers have the same material, it may not be easy to design such a ceramic substrate that has the impedance value of a certain range. Here, since the present embodiment may constitute the material of a certain layer constituting the multilayer ceramic substrate freely without any limitation, it may be easy to design the entire multilayer ceramic substrate to have the impedance value. According to another embodiment of the present disclosure, the second ceramic thin film may have a material having greater strength than that of the first ceramic thin film. Thus, the down warping of the entire multilayer ceramic substrate may be improved. According to another embodiment of the present disclosure, as the second ceramic thin film has a material that is different from that of the first ceramic thin film, the entire preparation process of the multilayer ceramic substrate may be improved to be easier. For example, of the entirety of layers, in a certain layer that requires only via halls without an inner electrode, by using a material favorable for forming a via hall (for example, material favorable to process a via hall) without considering the designing of the inner electrode, it is possible to improve the time and cost spent in designing. According to another embodiment of the present disclosure, the second ceramic thin film may have a material that functions differently from that of the first ceramic thin film.

For example, the second ceramic thin film may have a functional material that removes the electrostatic discharge (ESD) and/or pulse noise occurring in pulse forms or may have a magnetic material in which noise filtering is designed. More specifically, in the past, a plurality of ground layers used to be inserted between the layers in order to remove the noise of the electrical signals between the layers. This was due to the limitations in designing of having to use the same material for all the layers. However, when using the magnetic material, there is no need to insert multiple layers of ground layers.

Explanation on steps (1), and (3) to (8) will be substituted by the above explanation made regarding each step of the embodiment with reference to FIG. 3.

According to another embodiment of the present disclosure, in the multilayer ceramic substrate, the second ceramic thin film having a different material than the first ceramic thin film may be disposed on one or more layers of the entirety of layers, in order to reinforce the down warping, stability, design manageability and the like of the entirety of structure, that is, the multilayer ceramic substrate. Here, the down warping refers to the bending strength of the entirety of the multilayer ceramic substrate.

According to another embodiment of the present disclosure, the multilayer ceramic substrate may include not only the first ceramic thin film and the second ceramic thin film, but also a ceramic thin film having a material different from those of the first ceramic thin film and the second ceramic thin film.

According to another embodiment of the present disclosure, in addition to the embodiment of FIG. 5 or the embodiment of FIG. 6 having step (2) according to the embodiment mentioned above, a multilayer ceramic substrate having layers of different materials may be prepared.

FIG. 9 is a view illustrating the configuration of a multilayer ceramic substrate prepared according to the embodiment of FIG. 8.

The multilayer ceramic substrate according to an embodiment of the present disclosure 9010 may include a plurality of first ceramic thin films 9020 and second ceramic thin films 9030. Further, each of the plurality of first ceramic thin films 9020 and the second ceramic thin films 9030 may include a via electrode 9040 and an inner electrode 9050.

Detailed explanation on the multilayer ceramic substrate preparation method mentioned above will be substituted by the explanation made above with reference to FIG. 8.

Space Transformer for Reinforcing the Durability of Probe Pin and Method for Preparing the Same Referring to FIGS. 10, 11, and 12, a space transformer and a method for preparing the same according to an embodiment of the present disclosure will be explained.

FIG. 10 is a view illustrating the space transformer preparation method according to an embodiment of the present disclosure.

The space transformer preparation method according to the embodiment of the present disclosure includes the following steps: (1) firing a plurality of ceramic green sheets, to create a plurality of ceramic thin films, (2) forming a via hall in each of the plurality of ceramic thin films, (3) filling the formed via hall with conductive paste, and heat treating the via hall filled with the conductive paste, to form inner electrodes, (4) printing a pattern on a cross section of each of the plurality of ceramic thin films, and heat treating each printed pattern, to form inner electrodes, (5) applying a bonding agent on the cross section of each of the plurality of ceramic thin films avoiding the via halls, (6) aligning and laminating each of the plurality of ceramic thin films such that each of the plurality of ceramic thin films is electrically connected through the via electrode and the inner electrode, (7) firing or heat treating the laminated plurality of ceramic thin films, to create a multilayer ceramic substrate, (8) firing a ceramic green sheet, to create a ceramic thin film for immobilizing a probe pin, (9) forming a hall having the shape of a bottom surface of the probe pin on the ceramic thin film for immobilizing a probe pin, (10) applying an electrode material on a side surface of the formed hall, (11) applying a bonding agent on an upper surface of the multilayer ceramic substrate avoiding a portion that will meet the halls, (12) laminating the ceramic thin film for immobilizing a probe pin on the multilayer ceramic substrate such that the inner electrode formed on the upper surface of the multilayer ceramic substrate and the hall formed on the ceramic thin film for immobilizing a probe pin meet each other, (13) firing or heat treating the laminated multilayer ceramic substrate and the ceramic thin film for immobilizing a probe pin, (14) forming a solder lead on top of the inner electrode of the multilayer ceramic substrate existing inside the hall, (15) inserting the probe pin into the hall, to compress the solder lead, (16) heat treating the solder lead, to immobilize the probe pin in the hall and the inner electrode of the multilayer ceramic substrate.

Explanation on steps (1) to (7) will be substituted by the explanation of the embodiment made above with reference to FIG. 3 regarding the corresponding steps.

At step (8), the embodiment of the present disclosure may fire a new ceramic green sheet, to create the ceramic thin film for immobilizing a probe pin 11050.

At step (9), the embodiment of the present disclosure may form the hall 11080 having the shape of the bottom surface of the probe pin 11010 on the ceramic thin film for immobilizing a probe pin 11050. Here, the reason why the hall should have the shape of the bottom surface of the probe pin is to insert the probe pin into the hall and immobilize the inserted probe pin. According to the embodiment of the present disclosure, when the probe pin is inserted into the hall, a side surface distance 11090 between the hall and the probe pin may be designed to be less than 20 microns. According to the embodiment of the present disclosure, the ceramic thin film for immobilizing a probe pin is made of a ceramic material, and thus, the hall may be formed on the cross section of the thin film without breaking the thin film. According to the embodiment of the present disclosure, the thickness of the ceramic thin film for immobilizing a probe pin may be 20 to 100 microns. Moreover, according to the embodiment of the present disclosure, the hall may be formed in a position where the inner electrode 11070 of the multilayer ceramic substrate 11030 meeting the ceramic thin film for immobilizing a probe pin exists. In addition, the probe pin may be inserted into the hall through the solder lead and be immobilized, to be electrically connected with the inner electrode 11070 of the multilayer ceramic substrate 11030.

At step (10), the embodiment of the present disclosure may apply the electrode material 11040 on the side surface of the formed hall 11080. Here, the electrode material may be Ag, Cu, Au, Ni, Sn and the like, and a solder lead 11020 may be used to immobilize the probe pin 11010 in the ceramic thin film for immobilizing a probe pin 11050.

At step (11), the embodiment of the present disclosure may apply the bonding agent 11060 on the upper surface of the multilayer ceramic substrate 11030 avoiding the portion that will meet the hall 11080. Here, the bonding agent 11060 may be identical to the bonding agent being used to bond the layers between the multilayer ceramic substrate 11030. Detailed explanation on the bonding agent is as mentioned above.

At step (12), the embodiment of the present disclosure may laminate the ceramic thin film for immobilizing a probe pin on the multilayer ceramic substrate such that the inner electrode 11070 formed on the upper surface of the multilayer ceramic substrate and the hall 11080 formed in the ceramic thin film for immobilizing a probe pin meet each other. That is, another layer of ceramic thin film for immobilizing a probe pin may be laminated on top of the formed multilayer ceramic substrate.

At step (13), the embodiment of the present disclosure may fire or heat treat the laminated multilayer ceramic substrate and the ceramic thin film for immobilizing a probe pin.

At step (14), the embodiment of the present disclosure may form the solder lead 11020 on top of the inner electrode 11070 of the multilayer ceramic substrate existing inside the hall. Here, the solder lead may have the shape of a ball of a cream solder. According to the embodiment of the present disclosure, the hall may be a hall that penetrates the thin film in which the hall is formed, and the bottom of the hall where the solder lead is formed may be the upper surface of the inner electrode 11070 of the multilayer ceramic substrate.

At steps (15) and (16), the embodiment of the present disclosure may insert the probe pin 11010 into the hall 11080, to compress the solder lead. Moreover, the embodiment of the present disclosure may heat treat the solder lead, to immobilize the probe pin in the hall and the inner electrode 11070 of the multilayer ceramic substrate. Specifically, by compressing with the probe pin at the same time of the heat treating, the solder lead 11020 may change to liquid and flow between the hall and the probe pin, and then harden, thereby immobilizing the probe pin in the hall. Thus, the embodiment of the present disclosure may immobilize not only the lower surface of the probe pin but also all side surfaces of the probe pin in the ceramic thin film for immobilizing a probe pin. Moreover, by the hardened lead, the probe pin may be electrically connected to the inner electrode 11070 of the multilayer ceramic substrate.

Another embodiment of the present disclosure may form the plurality of halls in the ceramic thin film for immobilizing a probe pin and may form the solder lead in the formed plurality of halls in a mask printing or dispensing method in a lump sum. In addition, the same number of probe pins as the formed halls may be attached and inversely inserted into an immobilizing film (jig) arrayed to coincide with the position of the formed plurality of halls. Further, the plurality of probe pins attached to the immobilizing film may be inserted into the plurality of halls in a lump sum. Thereafter, upon immobilizing the plurality of probe pins in the plurality of halls by heat treating the formed solder lead in a lump sum, it is possible to detach the plurality of probe pins from the immobilizing film. Through this method, it is possible to immobilize the probe pins in the multilayer ceramic substrate efficiently in terms of time and cost.

Another embodiment of the present disclosure may form the halls in consideration of the position of the inner electrode existing on the upper surface of the multilayer ceramic substrate that will meet the ceramic thin film for immobilizing a probe pin before laminating the ceramic thin film for immobilizing a probe pin on the multiple ceramic substrate, and then laminate the ceramic thin film for immobilizing a probe pin on top of the multilayer ceramic substrate.

FIG. 11 is a front view of the space transformer prepared according to the embodiment of FIG. 10.

The space transformer 11200 according to the embodiment of the present disclosure may include a laminated multilayer ceramic substrate 11030 and a ceramic thin film for immobilizing a probe pin 11050. In addition, each of the plurality of ceramic thin films constituting the multilayer ceramic substrate may include a via electrode and an inner electrode. The ceramic thin film for immobilizing a probe pin 11050 may include a hall 11080 having the shape of a bottom surface of the probe pin 11010 and an electrode material 11040 applied on the side surface of the hall to immobilize the probe pin 11010 in the hall 11080. Moreover, the space transformer may include the probe pin 11010 that is immobilized in the hall through the solder lead 11020 and the electrode material 11040. Specifically, the probe pin may be immobilized in the multilayer ceramic substrate 11030 and the ceramic thin film for immobilizing a probe pin 11050 as the solder lead 11020 formed in the hall is heat treated.

Detailed explanation on the method for preparing the space transformer is as mentioned above with reference to FIG. 10.

11100 of FIG. 11 is a view illustrating the space transformer right before the probe pin is inserted and compressed, and 11200 is a view illustrating the completed space transformer after the probe pin is inserted and compressed and the solder lead is heat treated, thereby immobilizing the probe pin in the ceramic thin film for immobilizing a probe pin. 11060 represents the bonding agent for bonding the ceramic thin film for immobilizing a probe pin to the multilayer ceramic substrate, and 11030 represents the multilayer ceramic substrate. The rest of the detailed explanation on FIG. 11 is as mentioned above with reference to FIG. 10.

FIG. 12 is a top view of the space transformer prepared according to the embodiment of FIG. 10.

Detailed explanation on FIG. 12 is as mentioned above with reference to FIG. 10.

The scope of protection of the present disclosure is not limited to the disclosure and expression of the embodiment that is explicitly explained above. Further, it is to be noted that the scope of protection of the present disclosure cannot be limited due to any alteration or substitution that is apparent in the related art.

INDUSTRIAL AVAILABILITY

The present disclosure may be used in any industrial field where multilayer ceramic substrates are used.

What is claimed is:

1. A method for manufacturing a multilayered ceramic substrate comprising: a step of sintering a plurality of ceramic green sheets for each ceramic green sheet independently to create a plurality of ceramic thin plates;
   a step of forming a via-hole in each of the plurality of ceramic thin plates;
   a step of filling the via-hole formed in each of the plurality of ceramic thin plates for each ceramic thin plate independently with conductive paste and performing heat treatment to form a via-electrode;
   a step of printing a pattern on a cross-section of each of the plurality of ceramic thin plates for each ceramic thin plate independently with conductive paste and performing heat treatment to form an internal electrode;
   a step of applying a bonding agent on the cross-section of each of the plurality of ceramic thin plates for each ceramic thin plate independently while avoiding the via-hole;

a step of aligning and laminating each of the plurality of ceramic thin plates so that each of the plurality of ceramic thin plates are electrically connected to each other as the internal electrode formed on the cross-section of the ceramic thin plate and the via-electrode penetrating the ceramic thin plate are electrically connected; and a step of performing low temperature heat treatment on the laminated plurality of ceramic thin plates collectively at a temperature higher than the melting point of the bonding agent, lower than the melting point of the conductive paste and lower than the sintering temperature, to adhere the ceramic thin plate of each layer constituting the laminated plurality of ceramic thin plates to each other, wherein, by the low temperature heat treatment, the bonding agent forms a bonding layer between two ceramic thin plates laminated above and below the bonding agent.

2. The method for manufacturing a multilayered ceramic substrate according to claim 1, wherein the conductive paste comprises a glass component.

3. The method for manufacturing a multilayered ceramic substrate according to claim 1, wherein, conductivity of the via-electrode or the internal electrode is tested, and if there is a problem in the conductivity, the conductive paste of the via-hole or the conductive paste of the pattern is etched using an etching solution, and the via-hole is refilled or the pattern is reprinted.

4. The method for manufacturing a multilayered ceramic substrate according to claim 1, wherein each of the plurality of ceramic thin plates has a thickness of 10 to 500 microns, and the bonding layer formed by the bonding agent has a thickness of 2 to 100 microns, and each of the plurality of ceramic thin plates has a diameter of 12 inches or more.

5. A multilayered ceramic substrate formed by laminating a plurality of ceramic thin plates, wherein the plurality of ceramic thin plates are created by sintering a plurality of ceramic green sheets, each of the plurality of ceramic thin plates comprises a via-electrode and internal electrode, the via-electrode is formed by filling a via-hole formed in each of the plurality of ceramic thin plates with conductive paste and performing heat treatment, and the internal electrode is formed by printing a pattern on a cross-section of each of the plurality of ceramic thin plates with conductive paste and performing heat treatment, the multilayered ceramic substrate is created by applying a bonding agent on the cross-section of each of the plurality of ceramic thin plates while avoiding the via-hole, aligning and laminating each of the plurality of ceramic thin plates so that each of the plurality of ceramic thin plates are electrically connected to each other as the internal electrode formed on the cross-section of the ceramic thin plate and the via-electrode penetrating the ceramic thin plate are electrically connected, and performing low temperature heat treatment on the laminated plurality of ceramic thin plates collectively at a temperature higher than the melting point of the bonding agent, lower than the melting point of the conductive paste and lower than the sintering temperature, to adhere the ceramic thin plate of each layer constituting the laminated plurality of ceramic thin plates to each other, and by the low temperature heat treatment, the bonding agent forms a bonding layer between two ceramic thin plates laminated above and below the bonding agent.

* * * * *